United States Patent
Yeh et al.

(10) Patent No.: US 8,300,169 B2
(45) Date of Patent: Oct. 30, 2012

(54) TFT SUBSTRATE, LCD DEVICE USING SAME AND METHOD FOR MANUFACTURING TFT SUBSTRATE

(75) Inventors: Guan-Hua Yeh, Miao-Li (TW); Chai-Mei Liu, Miao-Li (TW); Hong-Gi Wu, Miao-Li (TW); Wei-Lun Liao, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 333 days.

(21) Appl. No.: 12/456,719

(22) Filed: Jun. 22, 2009

(65) Prior Publication Data

US 2009/0316092 A1     Dec. 24, 2009

(30) Foreign Application Priority Data

Jun. 20, 2008   (CN) .......................... 2008 1 0067938

(51) Int. Cl.
*G02F 1/136*     (2006.01)
(52) U.S. Cl. .......................... 349/43; 349/46
(58) Field of Classification Search .................. 349/43, 349/46
See application file for complete search history.

(56) References Cited

U.S. PATENT DOCUMENTS

| | | | | |
|---|---|---|---|---|
| 5,321,536 A | * | 6/1994 | Ishii et al. ........................ | 349/17 |
| 5,349,174 A | * | 9/1994 | Van Berkel et al. ........ | 250/208.1 |
| 5,844,540 A | | 12/1998 | Terasaki | |
| 6,330,387 B1 | * | 12/2001 | Salamon et al. .............. | 385/129 |
| 2005/0231656 A1 | * | 10/2005 | den Boer et al. ................ | 349/42 |
| 2005/0258341 A1 | * | 11/2005 | Nishikawa et al. ......... | 250/214.1 |
| 2007/0046619 A1 | * | 3/2007 | Sano et al. ..................... | 345/102 |
| 2007/0229452 A1 | * | 10/2007 | Sano et al. ..................... | 345/102 |
| 2007/0247558 A1 | | 10/2007 | Lin | |
| 2008/0211787 A1 | * | 9/2008 | Nakao et al. ................... | 345/175 |
| 2009/0135333 A1 | * | 5/2009 | Tai et al. ......................... | 349/61 |

FOREIGN PATENT DOCUMENTS

| | | | |
|---|---|---|---|
| CN | 101059610 A | | 10/2007 |
| JP | 6-11713 A | | 1/1994 |
| KR | 2005065970 A | * | 12/2003 |
| KR | 2005065970 A | * | 6/2005 |
| KR | 2006128240 A | * | 12/2006 |

* cited by examiner

*Primary Examiner* — K. Cyrus Kianni
(74) *Attorney, Agent, or Firm* — Bacon & Thomas, PLLC

(57) ABSTRACT

A thin film transistor (TFT) substrate includes a transparent substrate, a plurality of TFTs and a photosensitive capacitor formed on the transparent substrate. A capacitance of the photosensitive capacitor is variable on the condition of environment brightness. A method for manufacturing the TFT substrate and an LCD using the TFT substrate are also provided.

9 Claims, 4 Drawing Sheets

TFT SUBSTRATE, LCD DEVICE USING SAME AND METHOD FOR MANUFACTURING TFT SUBSTRATE

CROSS-REFERENCE TO RELATED APPLICATION

This application is related to, and claims benefit of, a foreign priority application filed in China as Application No. 200810067938.X on Jun. 20, 2008. The related application is incorporated herein by reference.

BACKGROUND

1. Technical Field

The present disclosure relates a thin film transistor (TFT) substrate, a method for manufacturing the TFT substrate, and a liquid crystal display (LCD) device using the TFT substrate.

2. Description of Related Art

Because LCD devices have the advantages of portability, low power consumption, and low radiation, they have been widely used in various portable information products such as notebooks, personal digital assistants (PDAs), video cameras, etc.

A conventional LCD device typically includes an LCD panel, a backlight module with a plurality of light sources for illuminating the LCD panel, and a backlight modulation circuit for modulating illumination provided by the backlight module. With the development of LCD technologies, a light detecting circuit including a light sensor has been developed to automatically adjust the brightness of the backlight module in different ambient environments. However, a typical light sensor has a complex structure and relatively high cost.

Therefore, an LCD device having a light sensor with simple structure and low cost is needed.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views, and all the views are schematic.

DETAILED DESCRIPTION

Reference will now be made to the drawings to describe various embodiments in detail.

Figure 1:
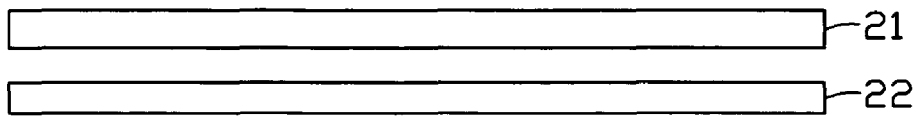
FIG. 1 is an exploded, side view of an LCD device of a first embodiment of the present disclosure, the LCD device including an LCD panel and a backlight module.

FIG. 1 is an exploded, side view of an LCD device provided by a first embodiment of the present disclosure. The LCD device 2 includes an LCD panel 21, and a backlight module 22 for illuminating the LCD panel 21.

Figure 2:
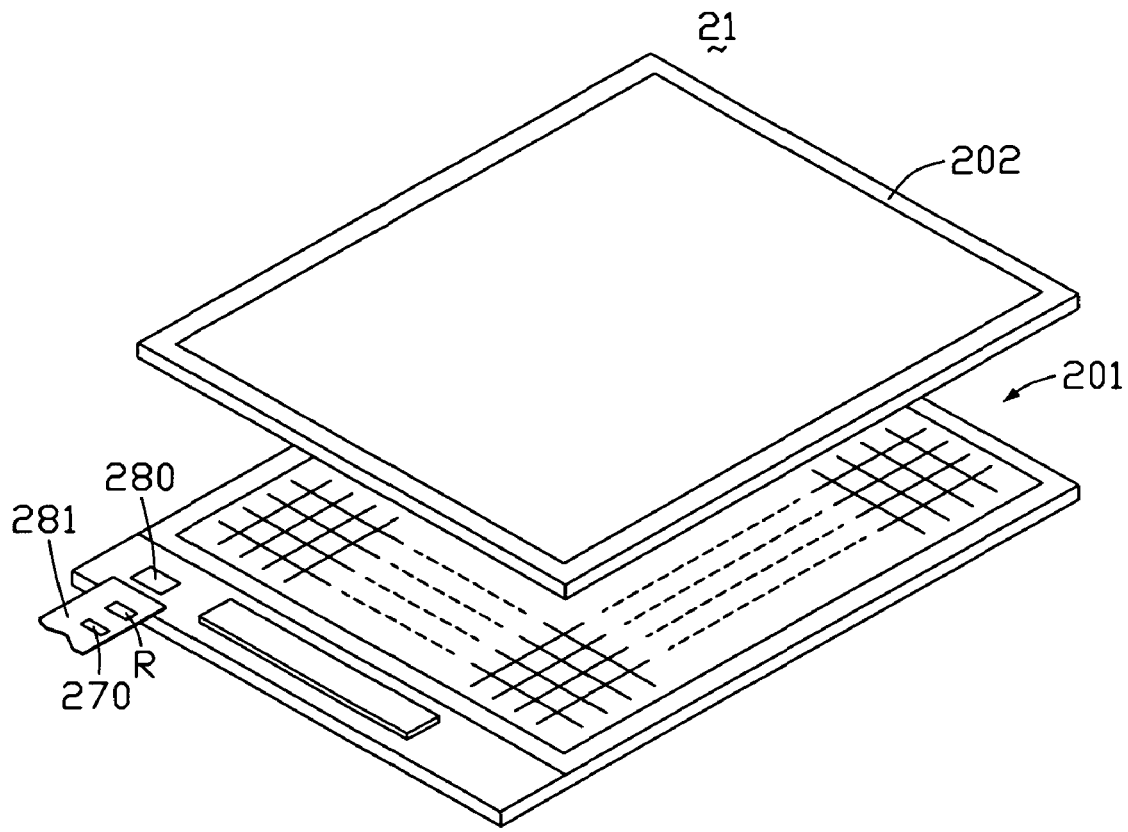
FIG. 2 is an abbreviated, isometric view of the LCD panel of the LCD device of FIG. 1, the LCD panel including a first substrate and a second substrate opposite to each other, and a photosensitive circuit.

FIG. 2 is an abbreviated, isometric view of the LCD panel 21. The LCD panel 21 includes a first substrate 201, a second substrate 202 opposite to the first substrate 201, and a liquid crystal layer (not shown) sandwiched between the first and second substrates 201, 202. The first substrate 201 is a thin film transistor (TFT) substrate. For example, the first substrate 201 can be a TFT array substrate. The second substrate 202 is a color filter (CF) substrate. A backlight control circuit 280 is arranged at a peripheral area of the first substrate 201. A flexible printed circuit board (FPCB) 281 including a power source 270 and a resistor R is electrically connected to the first substrate 201.

Figure 3:
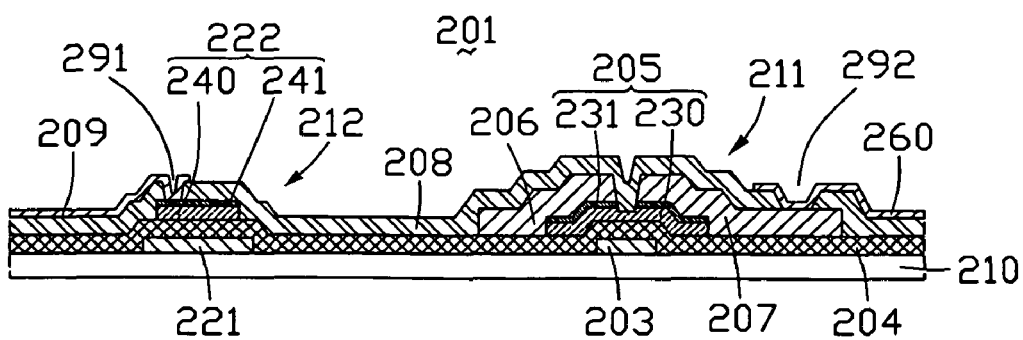
FIG. 3 is a side cross-sectional view of part of the first substrate of the LCD panel of FIG. 2.

Referring to FIG. 3, this is a side cross-sectional view of part of the first substrate 201. The first substrate 201 includes a transparent substrate 210, a plurality of thin film transistors (TFTs) 211 (only one shown), a photosensitive capacitor 212, a connecting electrode 209, and a plurality of pixel electrodes 260 (only one shown) corresponding to the plurality of TFTs 211. The TFTs 211, the photosensitive capacitor 212, the connecting electrode 209, and the pixel electrodes 260 are arranged on one side of the transparent substrate 210.

In an exemplary embodiment, the transparent substrate 210 is a glass substrate. A gate 203 of the TFT 211 and a first electrode 221 of the photosensitive capacitor 212 are formed on a side of the transparent substrate 210 that is adjacent to the liquid crystal layer. An insulating layer 204 including silicon nitride (SixNy) is formed covering the gate 203 of the TFT 211, the first electrode 221 of the photosensitive capacitor 212, and the transparent substrate 210. The form of silicon nitride can for example be $Si_3N_4$, $Si_2N_3$, etc. A semiconductor layer 205 is formed on the insulating layer 204, corresponding to the gate 203. The semiconductor layer 205 includes a lightly-doped a-Si (amorphous-silicon) layer 230 serving as a channel region, and a heavily-doped a-Si layer 231 used to reduce resistance of the lightly-doped a-Si layer 230. The heavily-doped a-Si layer 231 is discontinuous, such that the semiconductor layer 205 can also be considered to be discontinuous. In particular, the semiconductor layer 205 can be considered to have two sides. A source 206 and a drain 207 of the TFT 211 are formed on the two sides of the semiconductor layer 205, and are generally oriented symmetrically opposite to each other. A second electrode 222 of the photosensitive capacitor 212 is formed on the insulating layer 204, corresponding to the first electrode 221. An area of the second electrode 222 is less than that of the first electrode 221, as would be viewed in a direction from the top of FIG. 3 to the bottom of FIG. 3. The second electrode 222 is a semiconductor layer, and includes a lightly-doped a-Si layer 240 and a heavily-doped a-Si layer 241. A passivation layer 208 is formed covering the source 206, the semiconductor layer 205, the drain 207 of the TFT 211, the insulating layer 204, and the second electrode 222 of the photosensitive capacitor 212. In an exemplary embodiment, the passivation layer 208 includes SixNy, wherein SixNy can for example be $Si_3N_4$, $Si_2N_3$, etc. A first and a second connecting holes 291, 292 are formed in the passivation layer 208, corresponding to the second electrode 222 of the photosensitive capacitor 212 and the drain 207 of the TFT 211, respectively. The first connecting electrode 209 is formed on the passivation layer 208, and is electrically connected to the second electrode 222 of the photosensitive capacitor 212 via the first connecting hole 291. The pixel electrode 260 is disposed on the passivation layer 208, and is electrically connected to the drain 207 of the TFT 211 via the second connecting hole 292.

Figure 4:
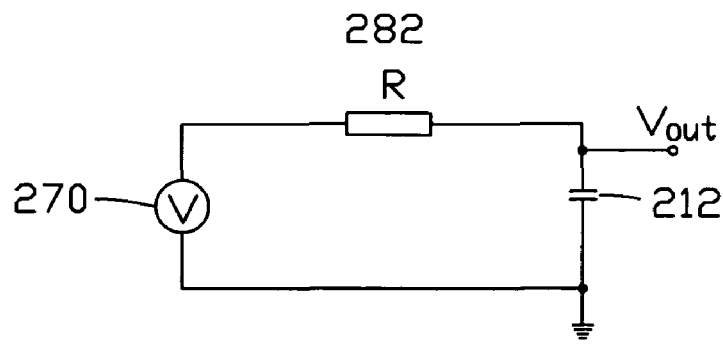
FIG. 4 is a diagram of a photosensitive circuit of the first substrate of FIGS. 2 and 3.

The power source 270, the resistor R, and the photosensitive capacitor 212 cooperatively define a photosensitive circuit 282. FIG. 4 is a circuit diagram of the photosensitive circuit 282. The first electrode 221 of the photosensitive capacitor 212 is grounded, and the second electrode 222 is electrically connected to the power source 270 via the resistor R for receiving electrical power. A node between the resistor R and the photosensitive capacitor 212 serves as an output terminal Vout to output voltages to the backlight control circuit 280.

Because the second electrode 222 of the photosensitive capacitor 212 is smaller than the first electrode 221, light beams from the backlight module 22 cannot reach the second electrode 222. That is, the second electrode 222 can only receive light beams from the ambient environment. When no ambient light beams reach the second electrode 222, the amount of conductive electrons and holes in the second electrode 222 is limited because the second electrode 222 is made of the semiconductor material (see above) is limited. Accordingly, a capacitance of the photosensitive capacitor 212 is small. When some ambient light beams reach the second electrode 222, some electrons in the second electrode 222 are excited, and the excited electrons provide additional conductive electrons and holes. Thus, the capacitance of the photosensitive capacitor 212 increases. The amount of excited conductive electrons and holes in the second electrode 222 is proportional to the amount of the ambient light beams reaching the second electrode 222. That is, the variation in capacitance of the photosensitive capacitor 212 is related to the ambient light intensity. Specifically, when the intensity of the ambient light beams increases, the capacitance of the photosensitive capacitor 212 increases, and the voltage output from the output terminal Vout correspondingly increases. When the intensity of the ambient light beams reduces, the capacitance of the photosensitive capacitor 212 reduces smaller, and the voltage output from the output terminal Vout correspondingly reduces. Thus, the output voltage can be regarded as an ambient brightness signal.

When the backlight control circuit 280 receives the voltage output from the output terminal Vout, the backlight control circuit 280 adjusts the brightness of the backlight module 22 according to the value of the voltage. Thus, the LCD device 2 has a function of automatically adjusting the brightness of the backlight module 22 based on the condition of the ambient brightness. The photosensitive capacitor 212 of the photosensitive circuit 282 has a simple structure and low cost.

Figure 5:
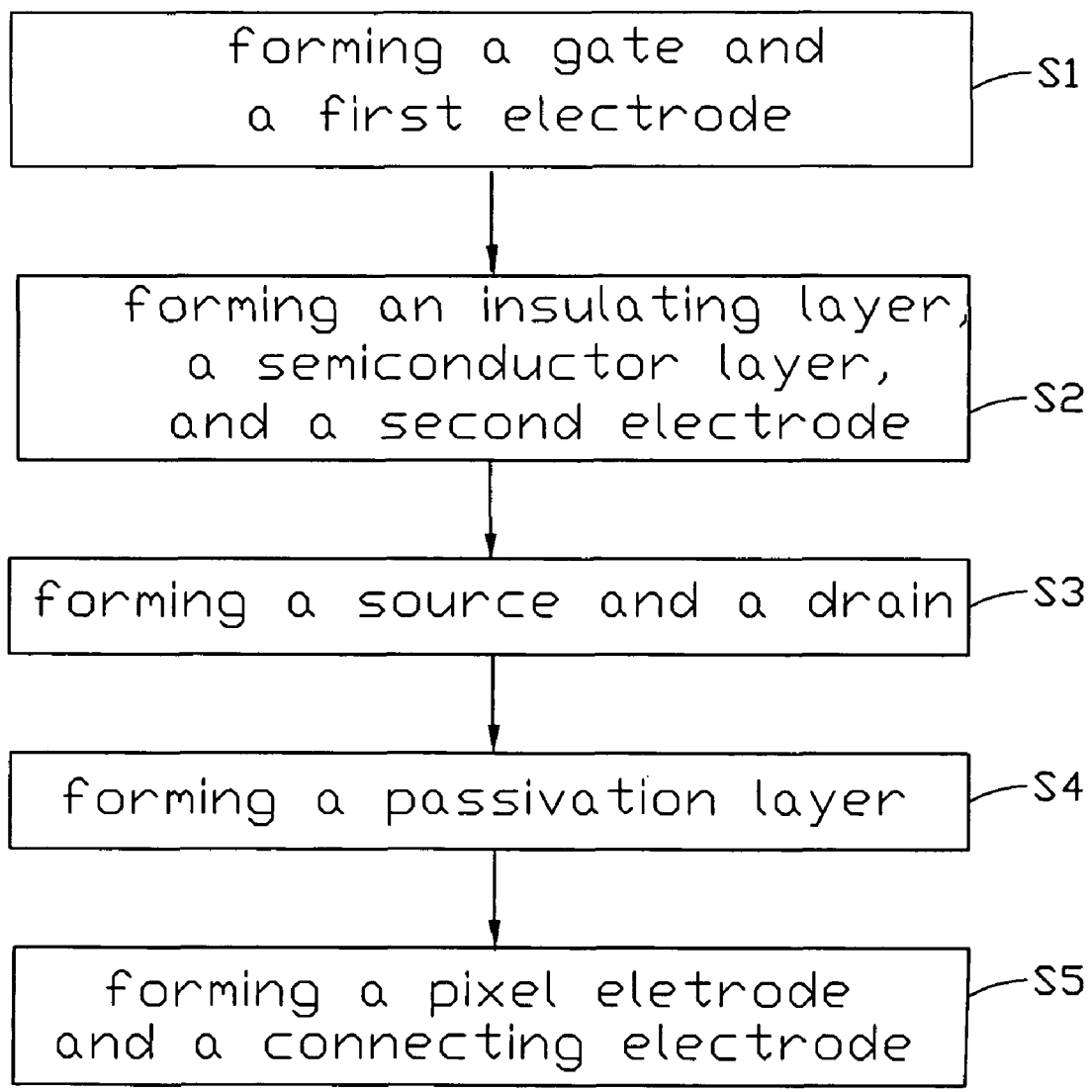
FIG. 5 is a flow chart of an exemplary method for manufacturing the first substrate of the LCD panel of the first embodiment.

Referring to FIG. 5, this is a flow chart summarizing an exemplary method for manufacturing the first substrate 201. The method is detailed below with reference to FIGS. 6-10, which are side cross-sectional views illustrating sequential stages in the method.

Figure 6:
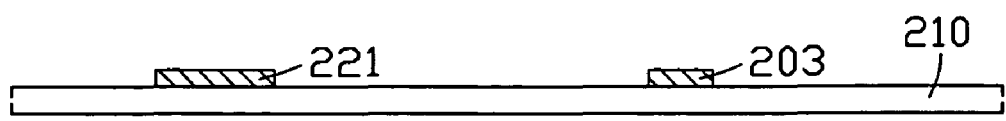
FIGS. 6-10 are side cross-sectional views illustrating sequential stages in the method of FIG. 5.

S1: forming a gate and a first electrode:

As shown in FIG. 6, a transparent substrate 210 such as a glass substrate is firstly provided. A first metal layer (not shown) and a first photoresist layer (not shown) are sequentially formed on the transparent substrate 210. The first metal layer can be a single layer or multi-layer structure, which includes aluminum (Al), molybdenum (Mo), chromium (Cr), tantalum (Ta), copper (Cu), or any combination of these metals. The first metal layer is for example formed by physical vapor deposition (PVD). An exemplary thickness of the first metal layer is about 300 μm. Thereafter a first photolithography and etching process (PEP) is performed to form a gate 203 and a first electrode 221. Then the first photoresist layer is removed.

Figure 7:
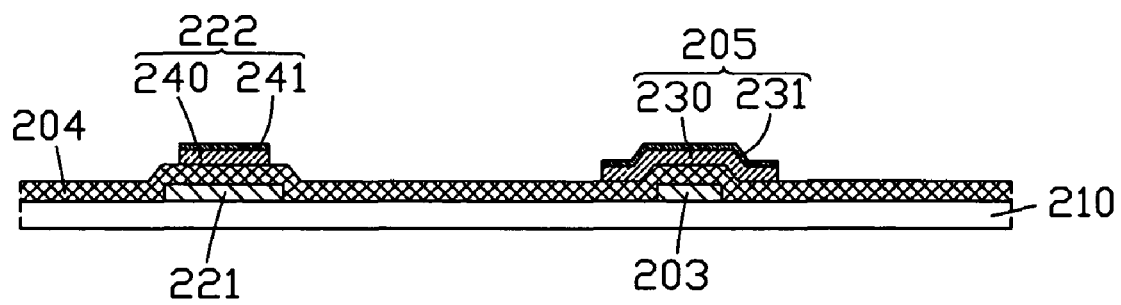

S2: forming an insulating layer, a semiconductor layer, and a second electrode:

Referring to FIG. 7, an insulating layer 204, a lightly-doped a-Si film (not shown), a heavily a-Si doped film (not shown), and a second photoresist layer (not shown) are sequentially formed on the transparent substrate 210. The insulating layer preferably includes silicon nitride (SixNy), and is for example formed by chemical vapor deposition (CVD). The form of SixNy can for example be $Si_3N_4$, $Si_2N_3$, etc. Next, CVD is again performed to form an a-Si film; and this is followed by ion implantation to form the lightly-doped a-Si film and the heavily-doped a-Si film. An exemplary thickness of the insulating layer is about 300 nm, an exemplary thickness of the lightly-doped a-Si film is about 150 nm, and an exemplary thickness of the heavily doped a-Si film is about 50 nm. Thereafter a second PEP is performed to form a semiconductor layer 205 on the insulating layer 204 corresponding to gate 203, and a second electrode 222 on the insulating layer 204 corresponding to the first electrode 221 as well. The semiconductor layer 205 includes a lightly-doped a-Si layer 230 and a heavily-doped a-Si layer 231. The second electrode 222 includes a lightly-doped a-Si layer 240 and a heavily-doped a-Si layer 241. Then, the second photoresist layer is removed.

Figure 8:
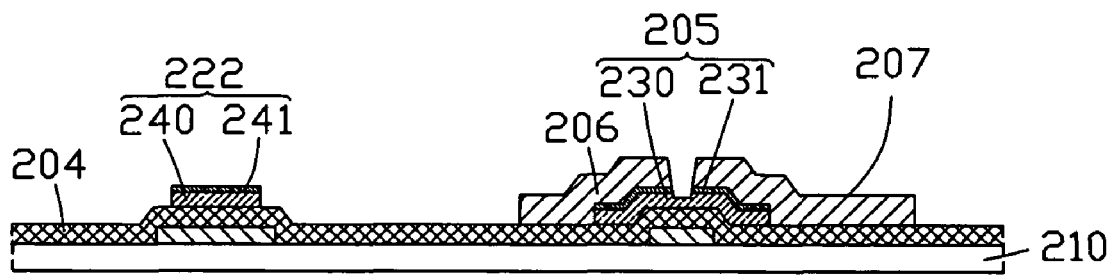

S3: forming a source and a drain:

Referring to FIG. 8, a second metal layer (not shown) and a third photoresist layer (not shown) are sequentially formed on the insulating layer 204. The second metal layer includes molybdenum (Mo) alloy or chromium (Cr), and is for example formed by PVD. In one embodiment, the second metal layer is made of Mo alloy or Cr. An exemplary thickness of the second metal layer is about 200 nm. Thereafter a third PEP is performed to form a source 206 and a drain 207. It is noteworthy that the patterned third photoresist layer serves as another mask for dry etching the heavily-doped a-Si layer 231. The dry etching includes over-etching into the light-doped a-Si layer 230, in order to avoid short circuits occurring in the source 206 and the drain 207. Then the third photoresist layer is removed.

Figure 9:
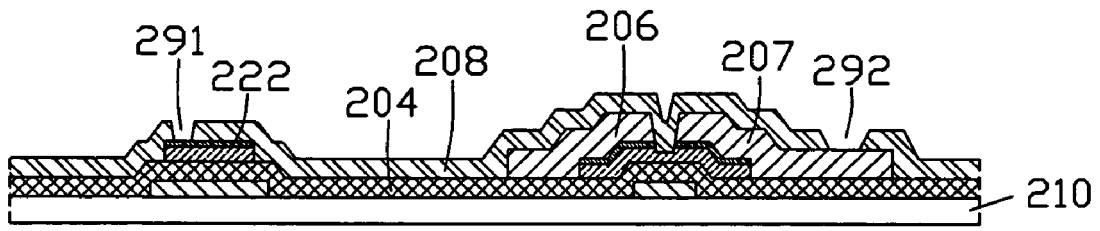

S4: forming a passivation layer:

As shown in FIG. 9, a passivation layer 208 is formed covering the source 206, the drain 207, the insulating layer 204, and the second electrode 222 on the first substrate 210. The passivation layer 208 serves as a back passivation layer. A fourth photoresist layer (not shown) is formed on the passivation layer 208. The passivation layer 208 preferably includes SixNy, and is for example formed by CVD. SixNy can for example be $Si_3N_4$, $Si_2N_3$, etc. An exemplary thickness of the passivation layer 208 is about 200 nm.

Thereafter, a fourth PEP is performed to form a first connecting hole 291 and a second connecting hole 292 in the passivation layer 208 to expose the second electrode 222 and the drain 207, respectively. Then the fourth photoresist layer is removed.

Figure 10:
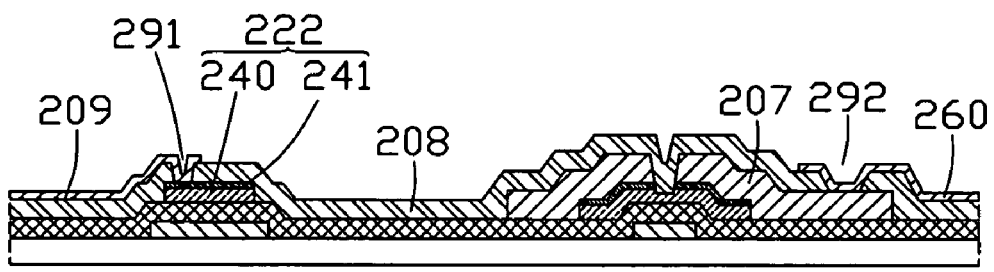

S5: forming a pixel electrode and a connecting electrode:

Referring to FIG. 10, a transparent conductive layer (not shown) and a fifth photoresist layer (not shown) are sequentially formed on the first substrate 210. The transparent conductive layer preferably includes indium tin oxide (ITO) or indium zinc oxide (IZO), and is for example formed by PVD. An exemplary thickness of the transparent conductive layer is about 50 nm. Thereafter a fifth PEP is performed to form a pixel electrode 260 and a connecting electrode 209. The pixel electrode 260 is electrically connected to the drain 207 via the second connecting hole 292. The connecting electrode 209 is electrically connected to the second electrode 222 via the first connecting hole 291. Then the fifth photoresist layer 145 is removed.

In the above-described method, the photosensitive capacitor 212 is able to be integrated on the first substrate 201 in the steps of manufacturing the TFT 211. That is, there is no need for any additional steps to manufacture the photosensitive capacitor 212. The method is simple and has a low cost. Furthermore, the photosensitive capacitor 212 is formed in the first substrate 201. Thus, the photosensitive capacitor 212 is protected from being damaged. The LCD device 2 can thereby have relatively high reliability.

Figure 11:
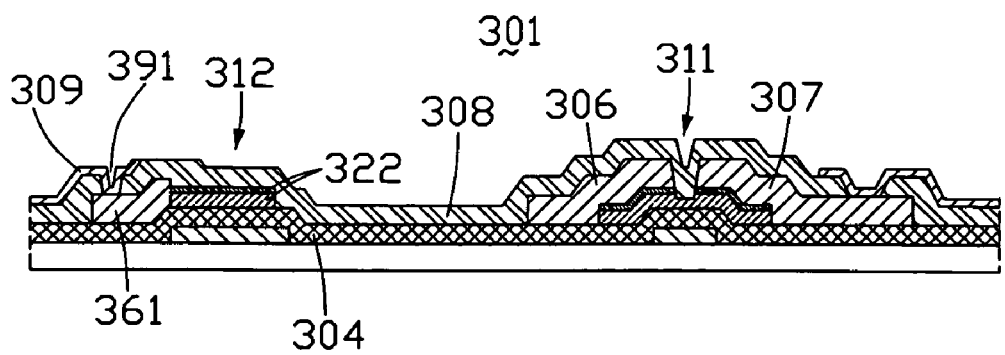
FIG. 11 is side cross-sectional view of part of a first substrate of an LCD device of a second embodiment of the present disclosure.

Referring to FIG. 11, a first substrate of an LCD device of a second embodiment of the present disclosure is shown. In general, elements of the first substrate 301 are the same as or similar to those of the first substrate 201 of the LCD device 2, therefore a detailed description of such elements is omitted in the interests of brevity. Differences between the first substrate 301 of the second embodiment and the first substrate 201 of the LCD device 2 include the following. A metal electrode 361 is arranged between an insulating layer 304 and a passivation layer 308. The metal electrode 361 is directly electrically connected to a second electrode 322 of a photosensitive capacitor 312, and is electrically connected to a connecting electrode 309 via a first connecting hole 391 of the passivation layer 308.

The second electrode 322 is made of semiconductor material, and the connecting electrode 309 which is made of ITO or IZO. Because the resistance of the metal electrode 361 is less than that of the second electrode 322 and is less than that of the connecting electrode 309, the metal electrode 361 reduces a contact resistance between the connecting electrode 309 and the second electrode 322. Thus, signal attenuation through the connecting electrode 309 and the second electrode 322 is reduced.

In an exemplary method of manufacturing the first substrate 301, the metal electrode 361 can be formed in the step of forming a source/drain 306, 307 of a TFT 311. The material of the metal electrode 361 can be the same as that of the source/drain 306, 307.

In other embodiments, more than one photosensitive capacitor 212 and/or 312 can be arranged at different parts of the first substrate 201 and/or 301, to detect ambient brightness more precisely. For example, four photosensitive capacitors 212 and/or 312 can be arranged at four corners of the first substrate 201 and/or 301, respectively.

It is to be further understood that even though numerous characteristics and advantages of the present embodiments have been set forth in the foregoing description, together with details of the structures and functions of the embodiments, the disclosure is illustrative only; and that changes may be in detail, especially in matters of shape, size, and arrangement of parts, within the principles of the embodiments, to the full extent indicated by the broad general meaning of the terms in which the appended claims are expressed.

What is claimed is:

1. A liquid crystal display (LCD) device, comprising:
a color filter substrate;
a thin film transistor (TFT) substrate opposite to the color filter substrate; and
a liquid crystal layer sandwiched between the color filter substrate and the TFT substrate;
wherein the TFT substrate comprises a plurality of TFTs and at least one photosensitive capacitor, the at least one photosensitive capacitor comprises a first electrode, a second electrode opposite to the first electrode, and an insulator media sandwiched between the first electrode and the second electrode, the second electrode is made of semiconductor material, and a capacitance of the at least one photosensitive capacitor is variable on condition that external light beams are applied to the second electrode;
wherein each TFT comprises a gate electrode, an insulating layer covering the gate electrode, and a semiconductor layer configured as a channel region of the TFT located on the insulating layer, the gate electrode of the TFT and the first electrode of the at least photosensitive capacitor are formed at a same layer, the insulation layer of the TFT further covers the first electrode of the at least one photosensitive capacitor, and the semiconductor layer of the TFT and the second electrode of at least one photosensitive capacitor are formed at a same layer.

2. The LCD device of claim 1, wherein the second electrode comprises a lightly-doped amorphous-silicon (a-Si) layer and a heavily-doped a-Si layer.

3. The LCD device of claim 1, wherein the first electrode is made of material selected from the group consisting of aluminum (Al), molybdenum (Mo), chromium (Cr), tantalum (Ta), copper (Cu), and any combination of any of these metals.

4. The LCD device of claim 1, wherein the TFT substrate further comprises a connecting electrode connected to the second electrode of the photosensitive capacitor.

5. The LCD device of claim 4, further comprising a power source and a resistor, the power source electrically connected to the second electrode of the at least one photosensitive capacitor via the connecting electrode.

6. The LCD device of claim 1, wherein the TFT substrate further comprises a plurality of pixel electrodes corresponding to the plurality of TFTs.

7. The LCD device of claim 1, wherein an area of the second electrode is less than an area of the electrode.

8. The LCD device of claim 1, wherein the second electrode of the at least one photosensitive capacitor is made of a same material as that of the semiconductor layer of the TFT.

9. The LCD device of claim 8, wherein the first electrode of the at least on photosensitive capacitor is made of a same material as that of the gate electrode of the TFT.

* * * * *